(12) United States Patent
Kato et al.

(10) Patent No.: US 8,516,414 B2
(45) Date of Patent: Aug. 20, 2013

(54) BEHAVIORAL SYNTHESIS DEVICE, BEHAVIORAL SYNTHESIS METHOD, AND COMPUTER PROGRAM PRODUCT

(75) Inventors: Yoshinosuke Kato, Tokyo (JP); Takao Toi, Tokyo (JP); Noritsugu Nakamura, Tokyo (JP); Toru Awashima, Tokyo (JP); Hirokazu Kami, Tokyo (JP)

(73) Assignee: NEC Corporation, Tokyo (JP)

( * ) Notice: Subject to any disclaimer, the term of this patent is extended or adjusted under 35 U.S.C. 154(b) by 624 days.

(21) Appl. No.: 12/409,856

(22) Filed: Mar. 24, 2009

(65) Prior Publication Data

US 2009/0249262 A1 Oct. 1, 2009

(30) Foreign Application Priority Data

Mar. 25, 2008 (JP) ................................. 2008-077081

(51) Int. Cl.
*G06F 17/50* (2006.01)
(52) U.S. Cl.
USPC ........... 716/104; 716/106; 716/107; 716/116; 716/117
(58) Field of Classification Search
USPC .................................. 716/100–107, 116–117
See application file for complete search history.

(56) References Cited

U.S. PATENT DOCUMENTS

| 5,956,497 | A * | 9/1999 | Ratzel et al. ................... 716/102 |
| 6,298,472 | B1 * | 10/2001 | Phillips et al. ................. 716/105 |
| 6,324,671 | B1 * | 11/2001 | Ratzel et al. ................... 716/103 |
| 2002/0133788 | A1 * | 9/2002 | Waters et al. ...................... 716/3 |
| 2002/0186246 | A1 * | 12/2002 | Burnette et al. ............... 345/771 |
| 2002/0194572 | A1 * | 12/2002 | McElvain et al. ................. 716/1 |
| 2003/0131325 | A1 * | 7/2003 | Schubert et al. .................. 716/4 |
| 2005/0144585 | A1 * | 6/2005 | Daw et al. ........................ 716/18 |

FOREIGN PATENT DOCUMENTS

| JP | 2006202330 A | 8/2006 |
| JP | 3987782 B | 10/2007 |
| JP | 3987783 B | 10/2007 |

\* cited by examiner

*Primary Examiner* — Paul Dinh

(57) ABSTRACT

A behavioral synthesis device include a profile unit that implements an electronic circuit at a reconfigurable hardware based on a first register transfer level description generated by a behavioral synthesis unit, actuates the implemented electronic circuit, and causes the electric circuit to output profile information from the actuated electronic circuit; and an optimizer that generates optimization information for optimizing a behavioral synthesis carried out by the behavioral synthesis unit based on the profile information that the profile unit causes the electric circuit to output, and outputs the generated optimization information to the behavioral synthesis unit, wherein the behavioral synthesis unit acquires a first behavioral level description, and subjects the acquired first behavioral level description to behavioral synthesis and generates the second register transfer level description based on the optimization information outputted by the optimizer.

11 Claims, 7 Drawing Sheets

BEHAVIORAL SYNTHESIS DEVICE, BEHAVIORAL SYNTHESIS METHOD, AND COMPUTER PROGRAM PRODUCT

INCORPORATION BY REFERENCE

This application is based on Japanese Patent Application No. 2008-077081 filed on Mar. 25, 2008 and including specification, claims, drawings and summary. The disclosure of the above Japanese Patent Application is incorporated herein by reference in its entirety.

TECHNICAL FIELD

The present invention relates to a superior behavioral synthesis device, a behavioral synthesis method, and a computer program product for optimizing electronic circuits implemented using reconfigurable hardware.

BACKGROUND ART

Technology such as an FPGA (Field Programmable Gate Array) or a DRP (Dynamically Reconfigurable Processor) has been proposed as reconfigurable hardware. Related technology is disclosed in Japanese Patent Publication Number 3987782, Japanese Patent Publication Number 3987783, and Unexamined Japanese Patent Application KOKAI Publication No. 2006-202330.

A design method using behavioral synthesis tools is effective in the design of electronic circuits implemented using reconfigurable hardware. The behavioral synthesis tools are tools that output RTL (Register Transfer Level) descriptions by subjecting behavioral level descriptions including information required for hardware implementation such as the bit width etc. of input ports and variables to behavioral synthesis.

Typically, a technique referred to as "static compiling" where optimization is carried out using only information acquired from the behavioral level description can be used in the field of behavioral synthesis.

SUMMARY

However, there is a strong demand to be able to carry out optimization using profile information obtained during operation when actually causing an electronic circuit implemented using reconfigurable hardware to operate.

For example, if it can be recognized that transition probability exhibits a tendency to go from a certain state to another state, it can be anticipated that it will be possible to improve the performance of the electronic circuit through the application of publicly-known optimization technology etc.

In order to respond to the above demand, it is an exemplary object of the present invention to provide a superior behavioral synthesis device, a behavioral synthesis method, and a computer program product that are capable of optimizing an electronic circuit implemented using reconfigurable hardware.

Further, a behavioral synthesis device of a first exemplary aspect of the present invention includes:

a receiving unit that receives input of a first behavioral level description expressing an electronic circuit implemented using reconfigurable hardware;

an adding unit that adds, to the first behavioral level description received by the receiving unit, a profile description that is a behavioral level description that causes the electronic circuit to collect profile information for the electronic circuit and output the collected profile information, and generates a second behavioral level description;

a behavioral synthesis unit that subjects the second behavioral level description generated by the adding unit to behavioral synthesis and generates a first register transfer level description;

a profile unit that implements the electronic circuit at the reconfigurable hardware based on the first register transfer level description generated by the behavioral synthesis unit, actuates the implemented electronic circuit, and causes the electric circuit to output the profile information from the actuated electronic circuit; and an optimizer that generates optimization information for optimizing the behavioral synthesis carried out by the behavioral synthesis unit based on the profile information that the profile unit causes the electric circuit to output, and outputs the generated optimization information to the behavioral synthesis unit, wherein the behavioral synthesis unit acquires the first behavioral level description, and subjects the acquired first behavioral level description to behavioral synthesis and generates the second register transfer level description based on the optimization information outputted by the optimizer.

Further, a method for synthesizing behavioral of a second exemplary aspect of the present invention includes:

a receiving step, by a receiving unit of the behavioral synthesis device, of receiving input of a first behavioral level description expressing an electronic circuit implemented using reconfigurable hardware;

an adding step, by an addition unit of the behavioral synthesis device, of adding, to the first behavioral level description received by the receiving unit, a profile description that is a behavioral level description that causes the electronic circuit to collect profile information for the electronic circuit and output the collected profile information, and generating a second behavioral level description;

a behavioral synthesis step, by a behavioral synthesis unit of the behavioral synthesis device, of subjecting the second behavioral level description generated by the adding unit to behavioral synthesis and generating a first register transfer level description;

a profile step, by a profile unit of the behavioral synthesis device, of implementing the electronic circuit at the reconfigurable hardware based on the first register transfer level description generated by the behavioral synthesis unit, actuating the implemented electronic circuit, and causing the electric circuit to output the profile information from the actuated electronic circuit; and an optimizing step, by an optimizer of the behavioral synthesis device, of generating optimization information for optimizing the behavioral synthesis carried out by the behavioral synthesis unit based on the profile information that the profile unit causes the electric circuit to output, and outputting the generated optimization information to the behavioral synthesis unit, wherein the behavioral synthesis unit acquires the first behavioral level description, and subjects the acquired first behavioral level description to behavioral synthesis and generates the second register transfer level description based on the optimization information outputted by the optimizer.

In order to achieve the above exemplary object, a computer program product of a third exemplary aspect of the present invention is:

a computer readable computer program product recorded with a program causing a computer to function as:

a receiving unit that receives input of a first behavioral level description expressing an electronic circuit implemented using reconfigurable hardware;

an adding unit that adds, to the first behavioral level description received by the receiving unit, a profile description that is a behavioral level description that causes the electronic circuit to collect profile information for the electronic circuit and output the collected profile information, and generates a second behavioral level description;

a behavioral synthesis unit that subjects the second behavioral level description generated by the adding unit to behavioral synthesis and generates a first register transfer level description;

a profile unit that implements the electronic circuit at the reconfigurable hardware based on the first register transfer level description generated by the behavioral synthesis unit, actuates the implemented electronic circuit, and causes the electric circuit to output the profile information from the actuated electronic circuit; and an optimizer that generates optimization information for optimizing the behavioral synthesis carried out by the behavioral synthesis unit based on the profile information that the profile unit causes the electric circuit to output, and outputs the generated optimization information to the behavioral synthesis unit, wherein the behavioral synthesis unit acquires the first behavioral level description, and subjects the acquired first behavioral level description to behavioral synthesis and generates the second register transfer level description based on the optimization information outputted by the optimizer.

Further, a behavioral synthesis device of a forth exemplary aspect of the present invention includes:

a receiving means that receives input of a first behavioral level description expressing an electronic circuit implemented using reconfigurable hardware;

an adding means that adds, to the first behavioral level description received by the receiving means, a profile description that is a behavioral level description that causes the electronic circuit to collect profile information for the electronic circuit and output the collected profile information, and generates a second behavioral level description;

a behavioral synthesis means that subjects the second behavioral level description generated by the adding means to behavioral synthesis and generates a first register transfer level description;

a profile means that implements the electronic circuit at the reconfigurable hardware based on the first register transfer level description generated by the behavioral synthesis means, actuates the implemented electronic circuit, and causes the electric circuit to output the profile information from the actuated electronic circuit; and an optimizer that generates optimization information for optimizing the behavioral synthesis carried out by the behavioral synthesis means based on the profile information that the profile means causes the electric circuit to output, and outputs the generated optimization information to the behavioral synthesis means, wherein the behavioral synthesis means acquires the first behavioral level description, and subjects the acquired first behavioral level description to behavioral synthesis and generates the second register transfer level description based on the optimization information outputted by the optimizer.

EXEMPLARY EMBODIMENT

First Embodiment

The following is a explanation with reference to the drawings of a behavioral synthesis device, a behavioral synthesis method, and a computer program product of the first embodiment.

Figure 1:
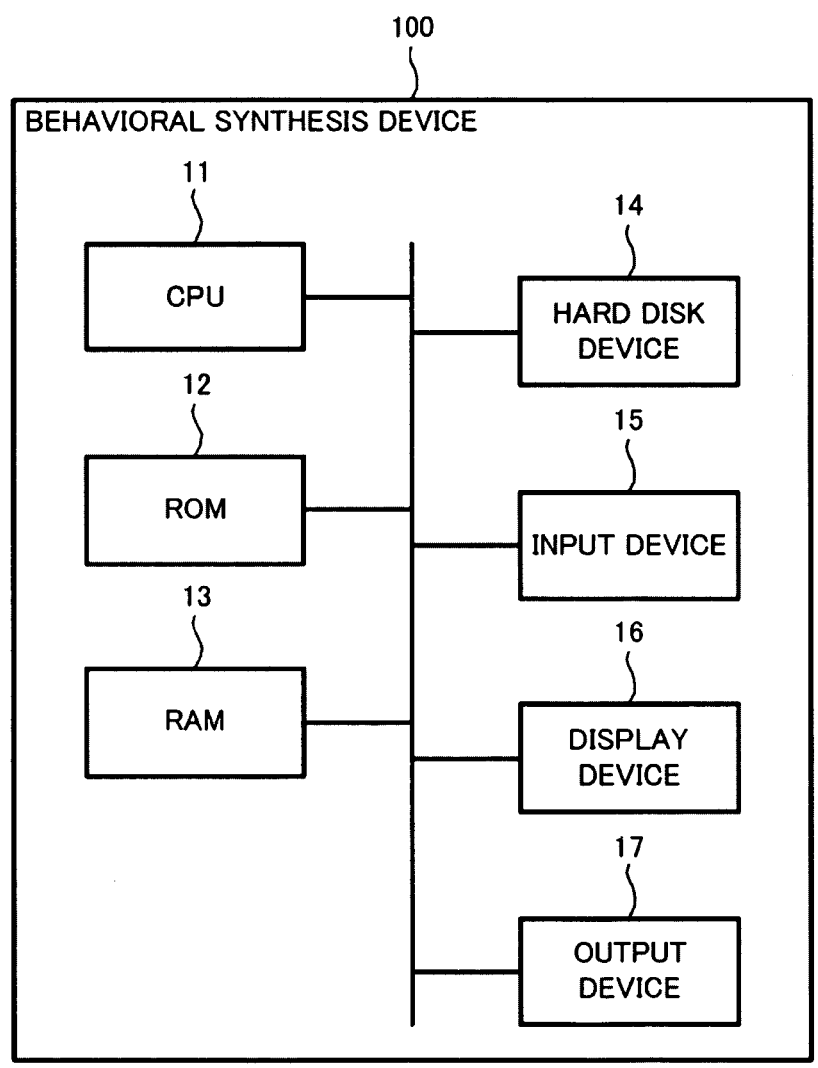
FIG. 1 is a block diagram showing a configuration for a behavioral synthesis device of a first embodiment of the present invention.

First, an explanation is given of a configuration for a behavioral synthesis device of this embodiment with reference to FIG. 1. A behavioral synthesis device 100 is a device that subjects a behavioral level description including information required for hardware implementation such as the bit width etc. for the input ports or variables to behavioral synthesis and obtains an RTL (Register Transfer Level) description that describes the configuration, arrangement, and wiring of a semiconductor integrated circuit (electronic circuit).

As shown in FIG. 1, the behavioral synthesis device 100 physically includes a CPU (Central Processing Unit) 11, a ROM (Read-Only Memory) 12, a RAM (Random Access Memory) 13, a hard disk device 14, an input device 15, a display device 16, and an output device 17. Each element of the configuration that the behavioral synthesis device 100 includes is connected via a bus.

The CPU 11 controls the overall operation of the behavioral synthesis device 100 in accordance with a program stored in the hard disk device 14. The CPU 11 then exchanges control signals and data via the bus connecting each of the structural elements.

An IPL (Initial Program Loader) executed immediately after the power supply is turned on is stored in the ROM 12. After the IPL is executed, the CPU 11 reads out a program stored in the hard disk device 14 to the RAM 13 and executes processing etc. to be hereinafter described in accordance with the read-out program. This program then causes the computer to function so as to carry out the processing to be hereinafter described. This program can also function in cooperation with an OS (Operating System) so as to cause the computer to carry out the processing to be hereinafter described.

The RAM 13 then temporarily stores the data and programs. The RAM 13 temporarily stores programs read out from the hard disk device 14 and data necessary in the behavioral synthesis processing, etc.

The hard disk device 14 stores programs executed by the CPU 11. The hard disk device 14 stores a behavioral level description intended for behavioral synthesis and an RTL description obtained through behavioral synthesis, etc.

The input device 15 receives input from the user such as parameters required in the behavioral synthesis under the control of the CPU 11 and receives requests from the user such as behavioral synthesis start requests. The input device 15 is, for example, a keyboard and mouse.

The display device 16 displays, for example, a screen for receiving the input of parameters etc. and behavioral synthesis start requests etc. from the user, a screen for displaying behavioral level descriptions, and a screen for displaying register transfer level descriptions, etc under the control of the CPU 11. The display device 16 is comprised of, for example, a liquid crystal display device.

The output device 17 outputs an RTL description obtained through behavioral synthesis and the configuration information obtained through logic synthesis of the RTL description, and the like, under the control of the CPU 11. The output device 17 is configured, for example, from a universal communication interface such as a USB port or a digital output port etc.

Next, an explanation is given of the basic configuration of the behavioral synthesis device 100 of this embodiment.

Figure 2:
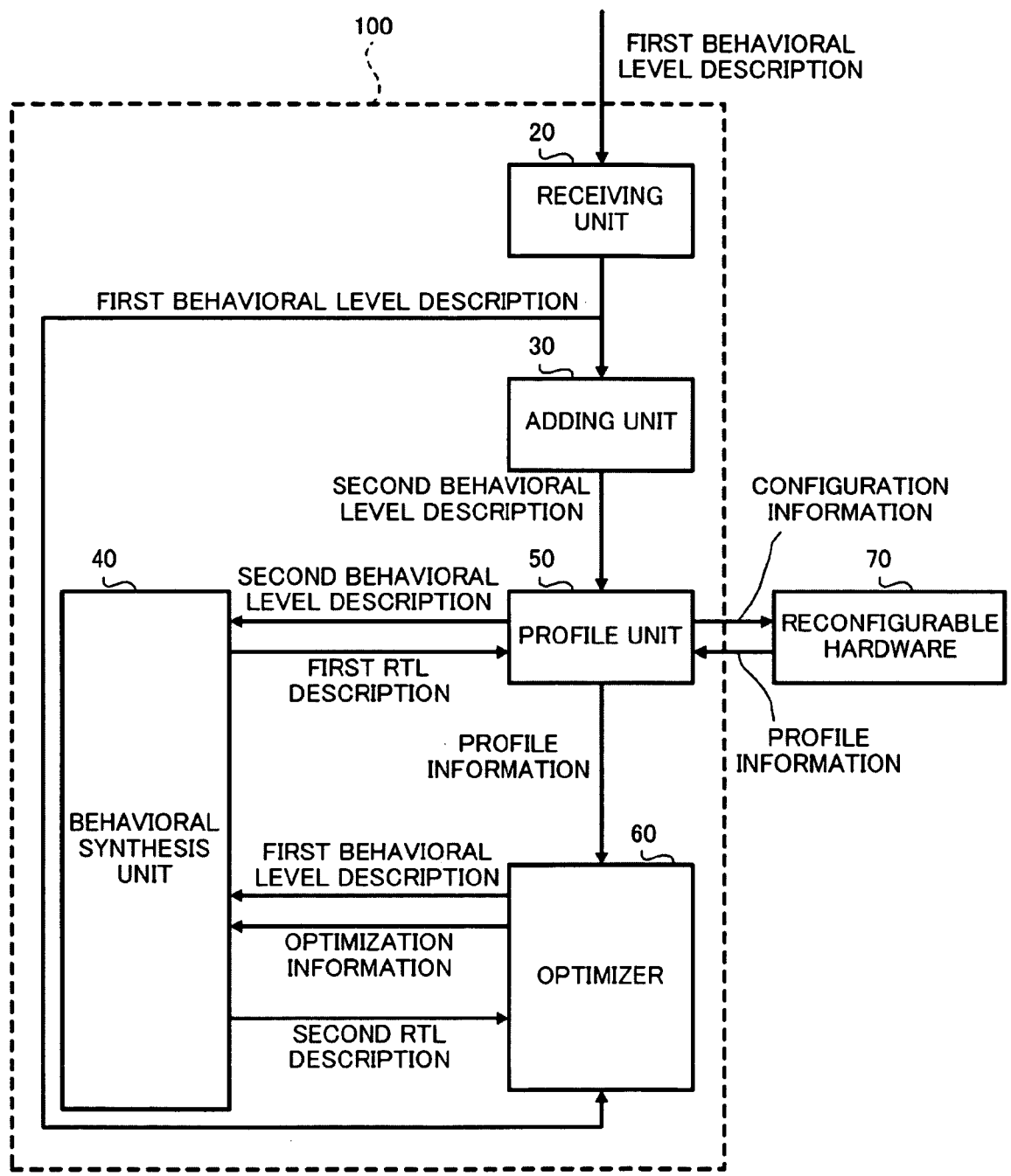
FIG. 2 is a block diagram showing a basic configuration for the behavioral synthesis device of the first embodiment of the present invention.

FIG. 2 is a block diagram showing a basic configuration for the behavioral synthesis device 100 of this embodiment. As shown in FIG. 2, the behavioral synthesis device 100 functionally includes a receiving unit 20, an adding unit 30, a behavioral synthesis unit 40, a profile unit 50, and an optimizer 60. The circuit generated by the behavioral synthesis device 100 is then mounted at reconfigurable hardware 70. This is to say that the behavioral synthesis device 100 generates an RTL description, generates configuration information from the generated RTL description, and writes the generated configuration information to the reconfigurable hardware 70. The behavioral synthesis device 100 then implements the electronic circuit at the reconfigurable hardware 70 based on the RTL description.

The receiving unit 20 then receives the input of a first behavioral level description expressing the electronic circuit implemented by the reconfigurable hardware 70. The receiving unit 20 then outputs the received first behavioral level description to the adding unit 30. The receiving unit 20 is implemented as a result of the CPU 11 operating in cooperation with the ROM 12, the RAM 13, and the input device 15.

The adding unit 30 adds a profile description to the first behavioral level description received by the receiving unit 20 and generates a second behavioral level description. The profile description is a behavioral level description that causes the electronic circuit implemented based on the RTL description to collect profile information for this implemented electronic circuit and output the collected profile information. The adding unit 30 is implemented as a result of the CPU 11 operating in cooperation with the ROM 12, the RAM 13, and the input device 15.

The behavioral synthesis unit 40 subjects the provided behavioral level descriptions to behavioral synthesis and generates the RTL description. This is to say that the behavioral synthesis unit 40 subjects the second behavioral level description generated by the adding unit 30 to behavioral synthesis and generates the first RTL description. The behavioral synthesis unit 40 acquires the first behavioral level description from the receiving unit 20 (or the adding unit 30), and subjects the acquired first behavioral level description to behavioral synthesis based on optimization information described hereinafter outputted by the optimizer 60 described in the following and generates the second RTL description. The behavioral synthesis unit 40 outputs the generated first or second RTL description to the profile unit 50 or the optimizer 60 (refer to FIG. 2, etc.). The behavioral synthesis unit 40 is implemented by the CPU 11 operating in cooperation with the ROM 12 and the RAM 13.

The profile unit 50 provides the second behavioral level description to the behavioral synthesis unit 40 and implements the electronic circuit at the reconfigurable hardware 70 based on the acquired first RTL description. The profile unit 50 then actuates the implemented electronic circuit so that the profile information is outputted. Namely, the profile unit 50 implements the electronic circuit at the reconfigurable hardware 70 based on the first RTL description generated by the behavioral synthesis unit 40, actuates the electronic circuit, and causes the electronic circuit to output the profile information from the electronic circuit. The profile unit 50 then implements the electronic circuit at the reconfigurable hardware 70 by generating configuration information from the first RTL description and writing the generated configuration information to the reconfigurable hardware 70. The profile unit 50 therefore implements the electronic circuit at the reconfigurable hardware 70 based on the first RTL description. The profile unit 50 is implemented as a result of the CPU 11 operating in cooperation with the ROM 12, the RAM 13, the input device 15, and the output device 17.

The optimizer 60 generates optimization information for optimizing behavioral synthesis carried out by the behavioral synthesis unit 40 based on the profile information that the profile unit 50 causes the electric circuit to output and outputs the generated optimization information to the behavioral synthesis unit 40. The optimizer 60 then provides the first behavioral level description to the behavioral synthesis unit 40, specifies the profile information as optimization information to the behavioral synthesis unit 40, and acquires the second RTL description from the behavioral synthesis unit 40. The optimizer 60 is implemented as a result of the CPU 11 operating in cooperation with the ROM 12, the RAM 13, and the input device 15.

Figure 3:
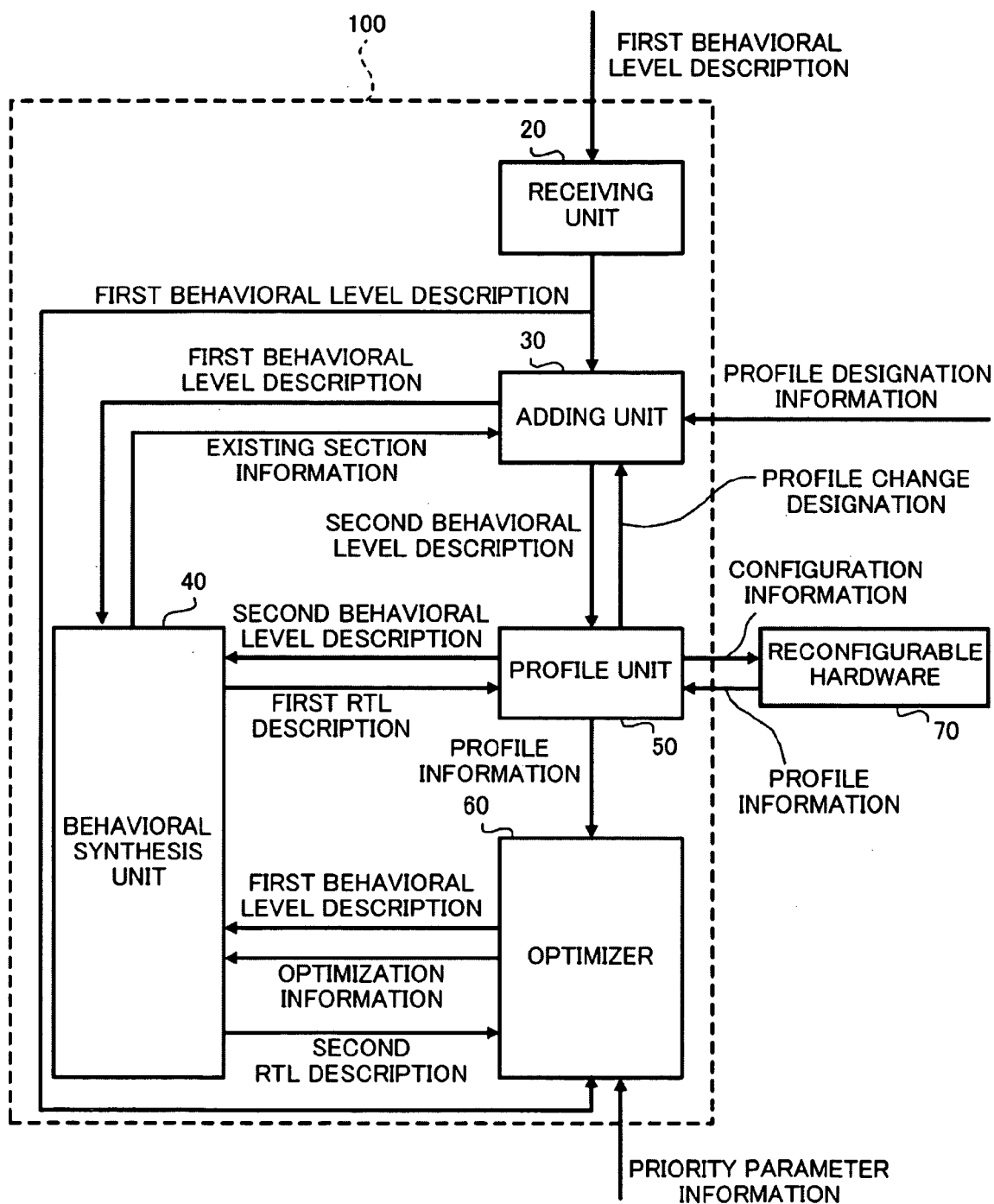
FIG. 3 is a block diagram illustrating an example of behavioral synthesis processing carried out by the behavioral synthesis device of the first embodiment of the present invention.
Figure 4:
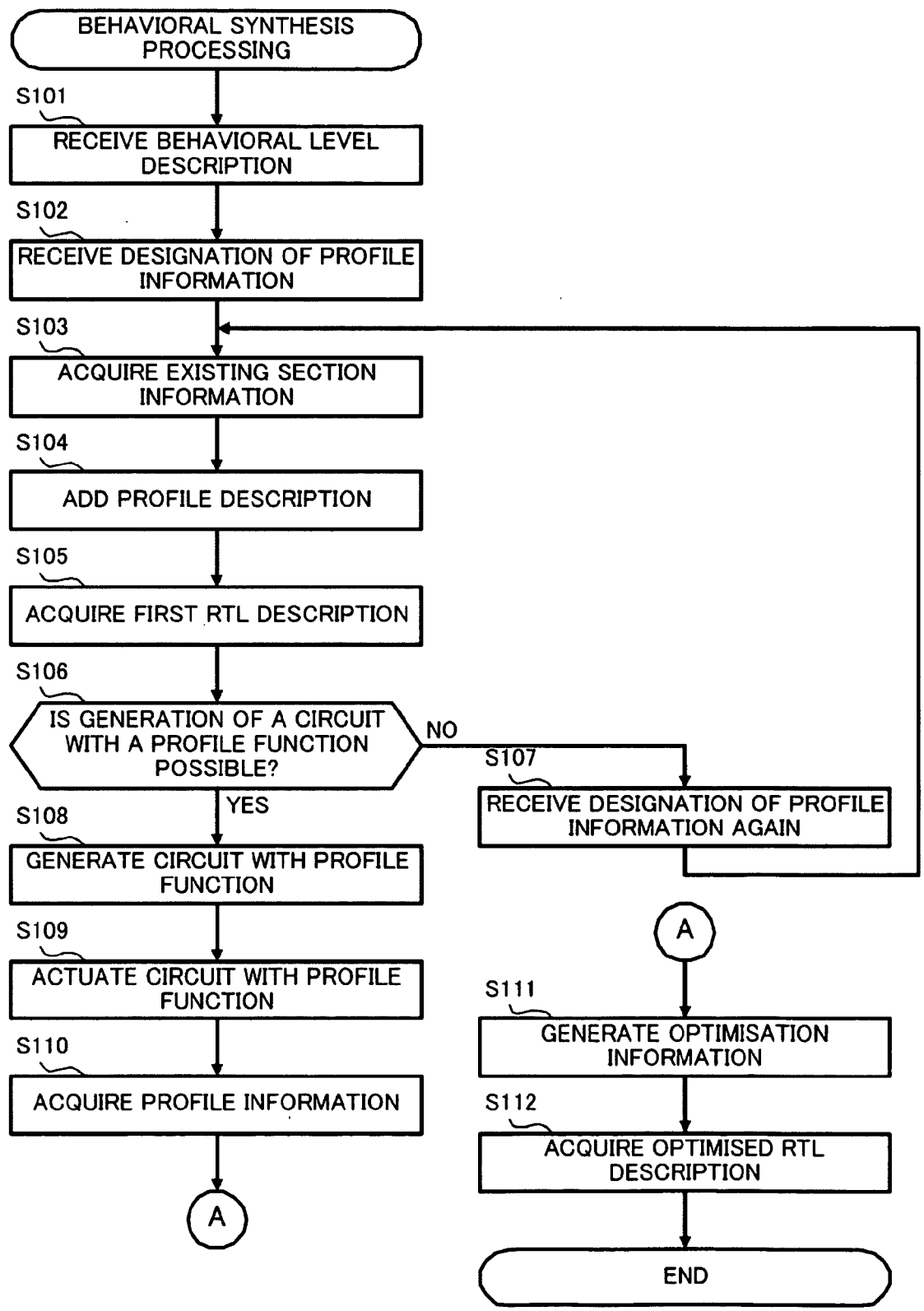
FIG. 4 is a flowchart illustrating an example of behavioral synthesis processing carried out by the behavioral synthesis device of the first embodiment of the present invention.

Next, a detailed explanation is given with reference to FIGS. 3, 4 and 5 of the behavioral synthesis processing executed by the behavioral synthesis device 100 of this embodiment.

When the behavioral synthesis device 100 then receives, for example, a behavioral synthesis start request from a user via the input device 15, the behavioral synthesis device 100 starts the behavioral synthesis processing shown in the flowchart of FIG. 4.

First, the receiving unit 20 receives a behavioral level description for the target for behavioral synthesis from the user (step S101). Specifically, the receiving unit 20 receives a designation for the behavioral level description that is to be a target of behavioral synthesis from the user. The receiving unit 20 then reads out the behavioral level description designated by the user (first behavioral level description) from the hard disk device 14 for storage in the RAM 13.

Next, the adding unit 30 receives a designation of the profile information of the electronic circuit to be collected from the electronic circuit from the user (step S102). The profile information is, for example, a number of times of execution of a state, a number of times of selection of conditional branching, values written to registers and memory, values inputted from an input terminal, and values outputted to an output terminal etc. The designated profile information (profile designation information) can be information specifying at least one item of information from within the aforementioned information.

The adding unit 30 acquires information such as existing section information by providing the first behavioral level description to the behavioral synthesis unit 40 to be subjected to behavioral synthesis (step S103). The behavioral synthesis unit 40 then acquires the existing section information etc. by subjecting the first behavioral level description to behavioral synthesis using a well-known method and outputs the information to the adding unit 30.

Next, the adding unit 30 adds the profile description to the first behavioral level description so as to generate the second behavioral level description (step S104).

Figure 5A:
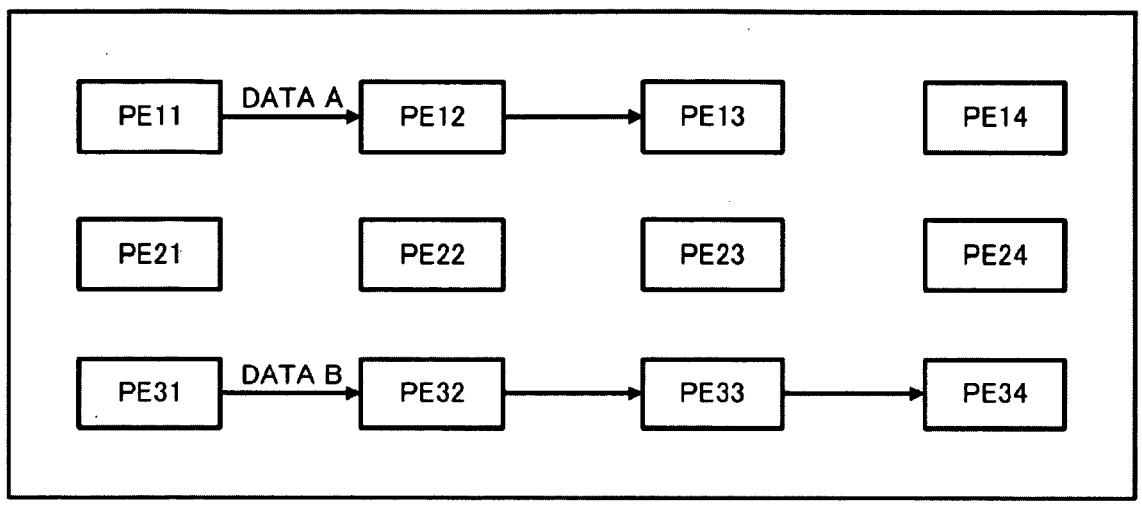
FIG. 5A is a diagram illustrating an example of a procedure for adding a profile description carried out by the behavioral synthesis device of the first embodiment of the present invention.
Figure 5B:
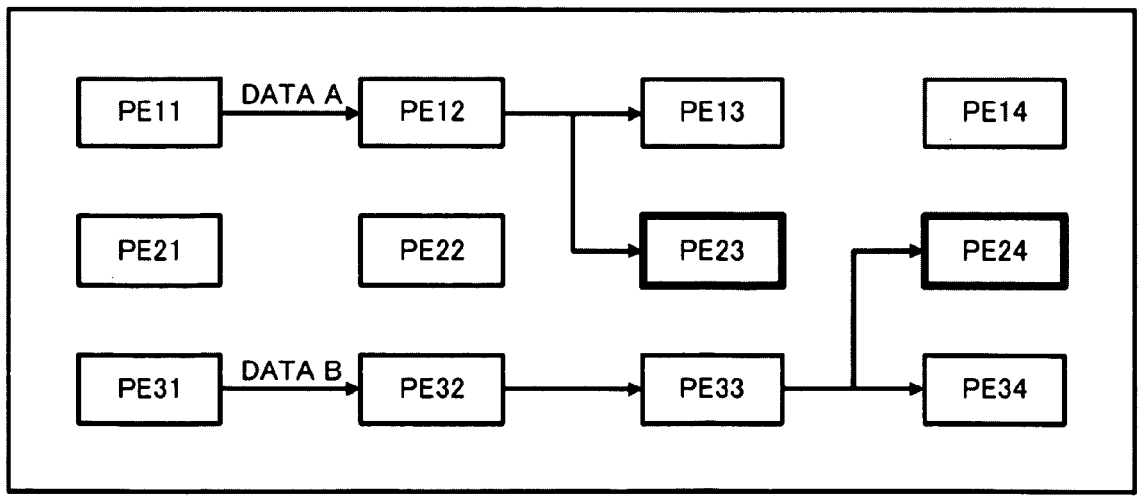
FIG. 5B is a diagram illustrating a further example of a procedure for adding a profile description carried out by the behavioral synthesis device of the first embodiment of the present invention.

A procedure for the adding unit 30 to acquire the profile designation information and the existing section information etc. for adding the profile description is described using FIGS. 5A and 5B.

As shown in FIGS. 5A and 5B, a large number of PEs (Processing Elements) are arranged two-dimensionally at the reconfigurable hardware 70. Only portions required for the explanation of the procedure for adding the profile description are shown in FIGS. 5A and 5B and portions such as wiring connecting each of the PEs and switches that are not required for the explanation are not shown. Each PE executes operations specified by the configuration information on data supplied by neighboring PEs and supplies the results of the operations to neighboring PEs. Each PE is taken to include a register for storing data.

The adding unit 30 acquires, from the behavioral synthesis unit 40, information for behavior of an electronic circuit, the existing section information (information of an unused memory and unused register in the case where an electronic circuit is focused) and information for unused PEs etc. generated when the behavioral synthesis unit 40 subjects the first behavioral level description to behavioral synthesis. Specifically, as shown, for example, in FIG. 5A, the adding unit 30 acquires information where data A is supplied from PE11 to PE13 via PE12 (the information of behavior of electronic circuit), information where data B is supplied from PE31 to PE34 via PE32 and PE33 (the information of behavior of electronic circuit), information indicating that PE14, PE21, PE22, PE23 and PE24 are not yet used, the existing section information and the like. This information is information that can be acquired if the first behavioral level description is subjected to behavioral synthesis. This is because the first behavioral level description denotes the electronic circuit implemented by the reconfigurable hardware 70.

It is efficient for the data to be collected at a location that is close to a path that the data passes through from the points of view of time and resources. The data can be collected at unused PEs and PEs neighboring the path that the data passes through. For example, as shown in FIG. 5B, the adding unit 30 decides to collect the data A at the PE23 and to collect the data B at the PE24. The adding unit 30 then adds the profile description to the first behavioral level description so that the electronic circuit collects the data A at PE23 and outputs the data A at a prescribed time, and collects the data B at the PE24 for output at a prescribed time. It can be detected what kind of data is collected, based on the profile designation information.

Next, the profile unit 50 acquires the first RTL description (step S105). Specifically, the profile unit 50 outputs the second behavioral level description generated by the adding unit 30 to the behavioral synthesis unit 40, to cause the behavioral synthesis unit 40 to generate the first RTL description by subjecting the second behavioral level description to behavioral synthesis, and acquires the generated first RTL description. The behavioral synthesis unit 40 then performs behavioral synthesis so that an electronic circuit based on the first behavioral level description of the second behavioral level description and an electronic circuit based on the profile description of the second behavioral level description operate in parallel and generates the first RTL description.

When an electronic circuit is implemented at the reconfigurable hardware 70, the profile unit 50 determines whether or not it is possible to generate a circuit equipped with a function for acquiring and outputting profile information for this electronic circuit (circuit with profile function) (step S106). Specifically, the profile unit 50 determines whether or not a circuit with a profile function generated based on the acquired first RTL description is of a size that mounting is possible on the reconfigurable hardware.

For example, the profile unit 50 determines whether or not the size of the acquired RTL description is a prescribed size or less. Alternatively, for example, the profile unit 50 acquires configuration information by subjecting the acquired RTL description to logic synthesis, and determines whether or not the size of this configuration information is a prescribed size or less.

When the profile unit 50 determines that it is not possible to generate a circuit with a profile function (step S106: NO), designation of the profile information is again requested to the user, and is specified at the adding unit 30 so as to change the profile information (step S107). Namely, the profile unit 50 outputs a profile change designation to the adding unit 30.

The adding unit 30 then again receives a profile information designation from the user in response to the designation of a change to the profile information from the profile unit 50 (step S107). The behavioral synthesis device 100 then executes the processing described above (step S103 to step S105) based on the profile designation information received again. The behavioral synthesis device 100 then repeats the processing described above (step S103 to step S106) until it is possible to generate the circuit with a profile function.

On the other hand, when it is determined that it is possible to generate the circuit with a profile function (step S106: YES), the profile unit 50 generates a circuit with a profile function (step S108). Specifically, the profile unit 50 then generates configuration information required in order to implement the circuit with a profile function on the reconfigurable hardware 70 by subjecting the acquired RTL description to logic synthesis.

The profile unit 50 then actuates the circuit with a profile function (step S109). Specifically, after writing the generated configuration information to the reconfigurable hardware 70, the profile unit 50 actuates the circuit with a profile function.

Here, the profile unit 50 acquires profile information from the circuit with a profile function (the electronic circuit implemented based on the first RTL description) implemented on the reconfigurable hardware 70 (step S110). The circuit with a profile function acquires and outputs the profile information during operation. The profile unit 50 then continues to acquire the profile information at prescribed times during the operation of the circuit with a profile function.

Next, the optimizer 60 generates optimization information based on the profile information (step S111). Specifically, the optimizer 60 generates optimization information necessary in order to generate an optimized RTL description from the behavioral level description based on the profile information acquired by the profile unit 50 and priority parameter information designated by the user. The priority parameter information is information specifying parameters for priority of the area, a number of processing cycles, and delay, or consumed power during optimization. The optimizer 60 generates optimization information in such a manner as to reduce at least one of the area, the number of processing cycles, the delays, or the consumed power.

In optimization where the area is given priority, for example, inputted values are detected as the profile information for a circuit receiving a 32-bit input. If it can be recognized from the acquired profile information that the values actually inputted are always 16-bit or less, the fact that the input is 16-bit can be adopted as a new restriction and the optimization can be carried out to reduce the area.

Finally, the optimizer 60 acquires the optimized RTL description (second RTL description) (step S112). Specifically, the optimizer 60 acquires an optimized second RTL description by providing the first behavioral level description to the behavioral synthesis unit 40 and by providing the generated optimization information to the behavioral synthesis unit 40 so as to generate the second RTL description. The behavioral synthesis unit 40 acquires the first behavioral level description, and subjects the acquired first behavioral level description to behavioral synthesis based on the optimization information outputted by the optimizer 60 so as to generate the second RTL description. The behavioral synthesis processing is then complete when the optimizer 60 acquires the optimized second RTL description.

According to the behavioral synthesis device 100 of this embodiment, profile information is acquired by causing the circuit with a profile function to actually operate and behavioral synthesis for the first behavioral level description is carried out based on the acquired profile information. It is therefore possible to acquire an optimized RTL description because the first behavioral level description is subjected to behavioral synthesis based on the profile information.

Function units are the basis of dynamic compiling using software. However, it is also possible to regard a register that gives an input or output in a certain state with the reconfigurable hardware as a function argument and it is therefore possible to execute optimization using an arbitrary section.

It is therefore possible to (1) reduce the amount of profile information to be intended to acquire, and (2) simplify hotspot analysis when a circuit is operating by utilizing existing section information, etc. for each resource in cooperation with the behavioral synthesis tool.

Second Embodiment

In the first embodiment, an example is shown where a first behavioral level description is subjected to behavioral synthesis using profile information acquired by actuating a circuit with a profile function (a circuit acquired by subjecting a second behavioral level description to behavioral synthesis). However, the circuit with a profile function is not a circuit that is just simply for acquiring profile information, it is also equipped with application functions originally intended for implementation (arithmetic functions, communication functions etc.). It is therefore also possible to adopt a configuration where an application is executed in a situation where the circuit with a profile function is mounted oil the reconfigurable hardware.

In this event, the behavioral synthesis device subjects the second behavioral level description to behavioral synthesis using profile information acquired by actuating the circuit with a profile function. The behavioral synthesis device is also capable of updating a circuit optimized during operation of an application by overwriting configuration information acquired from an RTL description obtained through behavioral synthesis of the second behavioral level description at the reconfigurable hardware 70. The explanation of this embodiment can refer to the explanation of the first embodiment where appropriate and the configuration etc. of the first embodiment can also be adopted for this embodiment when appropriate.

Figure 6:
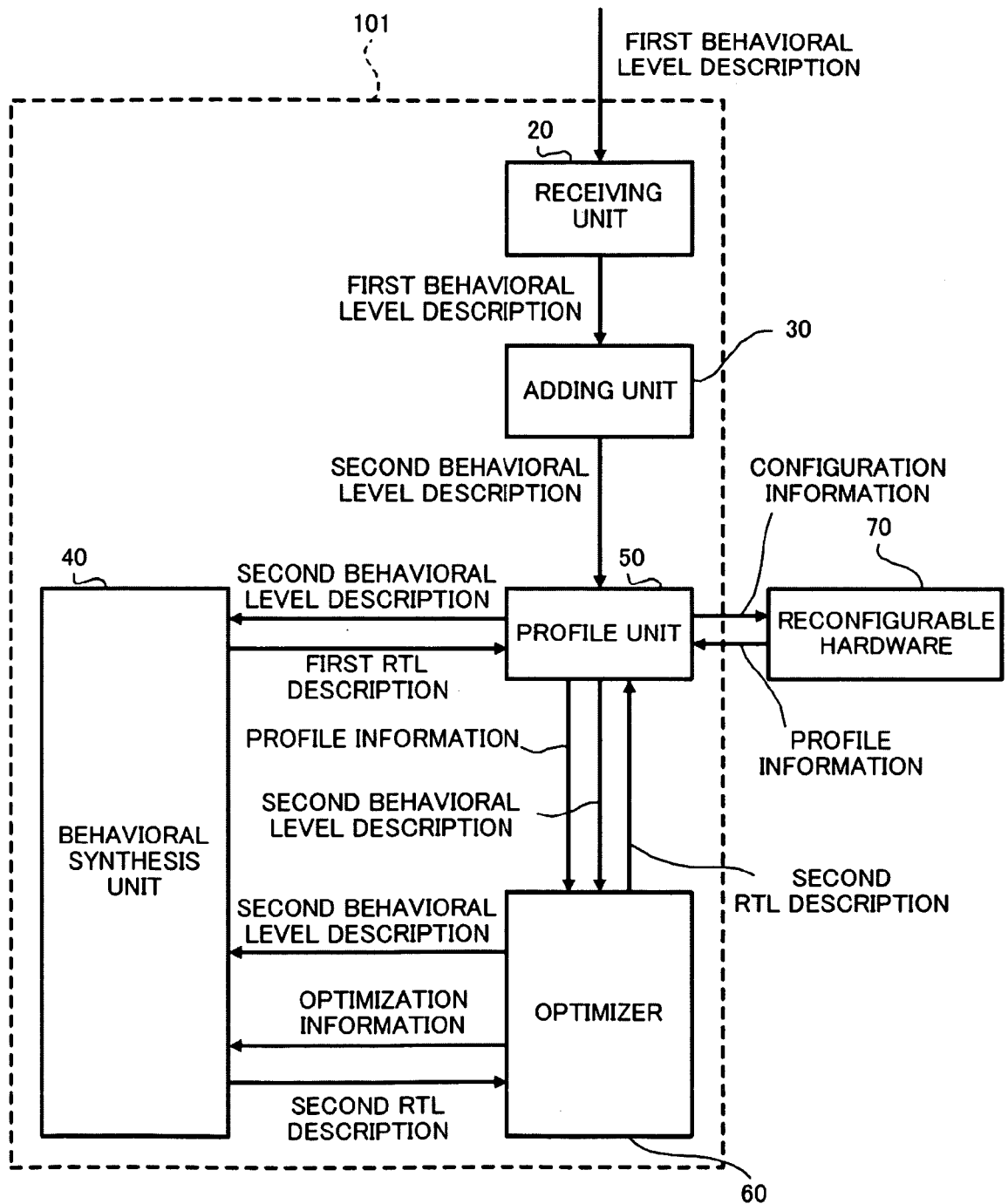
FIG. 6 is a block diagram showing a configuration for a behavioral synthesis device of a second embodiment of the present invention.

In the following, a detailed description is given with reference to FIGS. 6 and 7 of behavioral synthesis processing executed by the behavioral synthesis device of the second embodiment.

Figure 7:
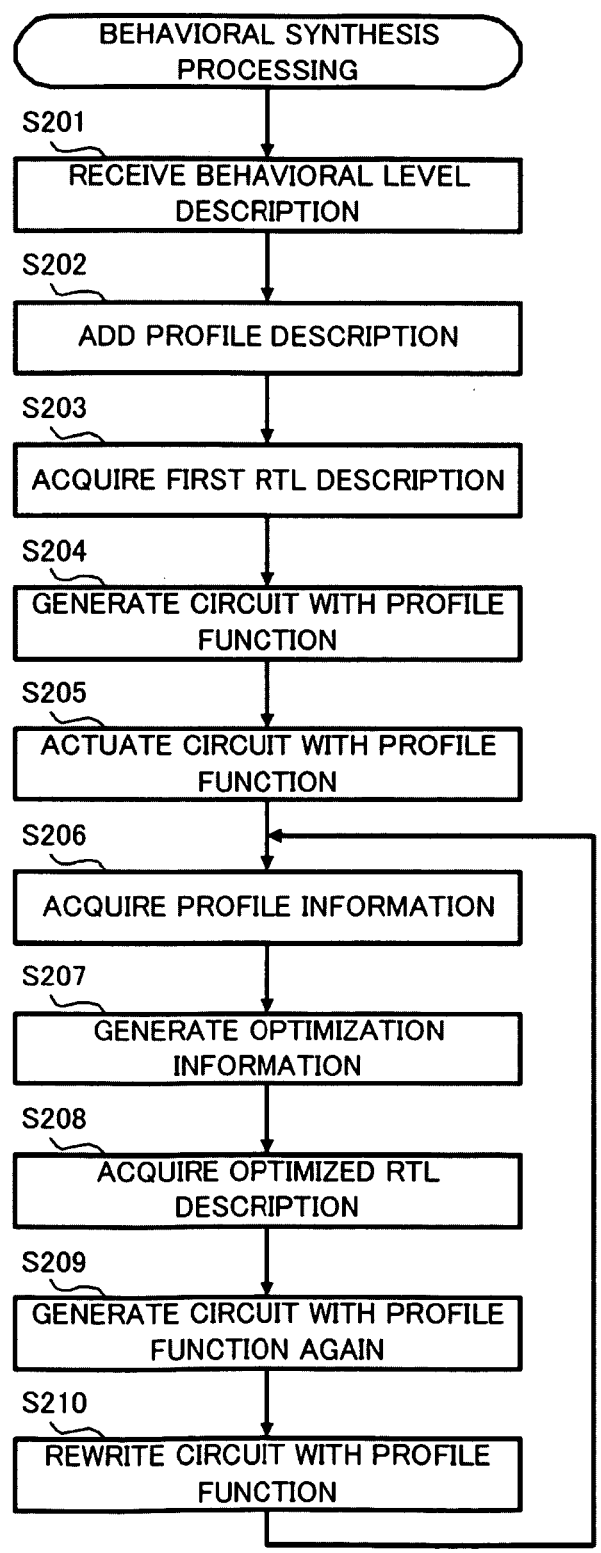
FIG. 7 is a flowchart illustrating an example of behavioral synthesis processing of the behavioral synthesis device of the second embodiment of the present invention.

When a behavioral synthesis device 101 receives, for example, a behavioral synthesis start request from a user via the input device 15, the behavioral synthesis device 101 starts the behavioral synthesis processing shown in the flowchart of FIG. 7.

First, the receiving unit 20 receives a behavioral level description for the target for behavioral synthesis from the user (step S201). The receiving unit 20 receives a designation for the behavioral level description that is to be a target of behavioral synthesis from the user. The receiving unit 20 then reads out the first behavioral level description designated by the user from the hard disk device 14 for storage in the RAM 13.

Next, the adding unit 30 adds the profile description to the first behavioral level description so as to generate the second behavioral level description (step S202). As described above, the adding unit 30 may add a profile description, based on profile designation information and existing section information, etc., or can add a profile description based on information decided in advance.

Next, the profile unit 50 generates the first RTL description (step S203). Specifically, the profile unit 50 hands over the second behavioral level description generated by the adding unit 30 to the behavioral synthesis unit 40 to subject the second behavioral level description to behavioral synthesis, causes the behavioral synthesis unit 40 to generate the first RTL description and acquires the generated first RTL description.

Here, for ease of understanding, an explanation is given taking a circuit generated based on the first RTL description acquired by the profile unit 50 to be of a size that the circuit is capable of being mounted on the reconfigurable hardware 70. Please refer to the first embodiment for the case where the circuit generated based on the first RTL description is of a size that the circuit is not capable of being mounted on the reconfigurable hardware 70.

The profile unit 50 then generates a circuit with a profile function (step S204). Specifically, the profile unit 50 generates configuration information required in order to implement the circuit with a profile function on the reconfigurable hardware 70 by subjecting the acquired first RTL description to logic synthesis.

The profile unit 50 then actuates the circuit with a profile function (step S205). Specifically, after writing the generated configuration information to the reconfigurable hardware 70, the profile unit 50 actuates the circuit with a profile function.

Here, the profile unit 50 acquires profile information from the circuit with a profile function implemented on the reconfigurable hardware 70 (step S206). The circuit with a profile function acquires and outputs the profile information during operation. The profile unit 50 then continues to acquire the profile information at prescribed times during the operation of the circuit with a profile function.

Next, the optimizer 60 generates optimization information based on the profile information (step S207). Specifically, the optimizer 60 generates optimization information necessary in order to acquire the optimized RTL description based on the profile information acquired by the profile unit 50. The optimizer 60 may also generate optimization information based on priority parameter information specified by the user as described above.

The optimizer 60 acquires the optimized RTL description (second RTL description) (step S208). Specifically, the optimizer 60 acquires an optimized RTL description by providing the second behavioral level description to the behavioral synthesis unit 40 and by providing the generated optimization information to the behavioral synthesis unit 40 so as to generate the RTL description. The behavioral synthesis unit 40 acquires the second behavioral level description from the optimizer 60, subjects the acquired second behavioral level description to behavioral synthesis based on the optimization information outputted by the optimizer 60, and generates the second RTL description. The behavioral synthesis unit 40 may also acquire the second behavioral level description from other units.

The profile unit 50 then generates a circuit with a profile function again (step S209). Specifically, the profile unit 50 generates configuration information required in order to implement the circuit with a profile function on the reconfigurable hardware 70 by acquiring the second RTL description from the optimizer 60 and subjecting the acquired second RTL description to logic synthesis.

The profile unit 50 then rewrites the circuit with a profile function to the reconfigurable hardware 70 (step S210). Specifically, the profile unit 50 updates the circuit implemented on the reconfigurable hardware 70 by writing the generated configuration information to the reconfigurable hardware 70 at prescribed times.

After this, the behavioral synthesis device 101 then repeats the processing of step S206 to step S210. The profile unit 50, further, actuates the electronic circuit based on the second register transfer level description generated by the behavioral synthesis unit 40 and causes the electronic circuit to re-output the profile information. The optimizer 60 then re-generates the optimization information for optimizing the behavioral synthesis carried out by the behavioral synthesis unit 40 based on the profile information re-outputted by the profile unit 50 and re-outputs the generated optimization information to the behavioral synthesis unit 40. The behavioral synthesis unit 40 then subjects the second behavioral level description to behavioral synthesis based on the optimization information re-outputted by the optimizer 60 and re-generates the second register transfer level description.

According to the behavioral synthesis device 101 of the second embodiment, profile information is acquired while applications using the circuit with a profile function are running. It is then possible to dynamically overwrite the generated configuration information based on the acquired profile information. The circuit mounted on the reconfigurable hardware can therefore be replaced by a circuit optimized during operation.

According to the behavioral synthesis device 101 of the second embodiment, applications are made to run using the circuit with a profile function. However, it is not necessary to add resources because the configuration is such that the circuit portion implementing the profile function uses resources that are not used in the operation of the applications. Further, the circuit portion implementing the profile function operates in parallel with the circuit portion implementing the application. It is therefore possible to maintain the operating speed of the application circuit without exerting any influence on the operation of the original application.

Modified Example

The first behavioral level description, a profile description, and the second behavioral level description are typically described using high-level programming languages such as C, C++, SystemC, and Java (registered trademark). However, a description using an intermediate representation that enables ease of processing by the computer implementing the behavioral synthesis device is also possible.

It is also possible to describe the profile description using a language or intermediate representation for describing the register transfer level description rather than describing the profile description using a high-level programming language. In this event, the profile description corresponds to a register transfer level description for implementing the electronic circuit outputted after collecting the profile information.

The second behavioral level description outputted by the adding unit 30 can also be a combination of the first behavioral level description and the profile description constituted by the register transfer level description.

When the second behavioral level description is provided, the behavioral synthesis unit 40 first subjects the first behavioral level description contained therein to behavioral synthesis and obtains a register transfer level description. A profile description is then added to the obtained register transfer level description, the results of which are returned to the profile unit 50 as generated results.

A description is given in the first and second embodiments where the program is stored in advance in a storage device. A program for causing a part or all of the behavioral synthesis device to operate or to execute the processing described above may be stored and distributed on a computer-readable portable recording medium such as a flexible disk, CD-ROM (Compact Disk Read-Only Memory), DVD (Digital Versatile Disk), or an MO (Magneto-Optical Disk), and can be installed on a separate computer so as to cause each part to function as described above, or cause the above steps to be executed. The ROM 12 (refer to FIG. 1), the RAM 13 (refer to FIG. 1), the hard disk device 14 (refer to FIG. 1) or a portable storage medium such as a computer readable recording medium that are capable of storing a program for executing the processing described above constitute a computer program product.

It is also possible for the program to be stored on a disk device etc. that is on a server device on the Internet so that, for example, the program can be downloaded to a computer through superposition with a carrier wave for execution.

As described above, according to the first embodiment, the second embodiment, and the modified example, it is possible to provide a superior behavioral synthesis device, a behavioral synthesis method, and a computer readable computer program product that stores a program for implementing the behavioral synthesis device and the behavioral synthesis method on a computer, for optimizing an electronic circuit implemented using reconfigurable hardware.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:
1. A behavioral synthesis device comprising:
 a receiving unit that receives input of a first behavioral level description expressing an electronic circuit that operates a predetermined application and is implemented using reconfigurable hardware;

an adding unit that adds, to the first behavioral level description received by the receiving unit, a profile description that is a behavioral level description that causes the electronic circuit to collect profile information for the electronic circuit and output the collected profile information, and generates a second behavioral level description;

a behavioral synthesis unit that subjects the second behavioral level description generated by the adding unit to behavioral synthesis and generates a first register transfer level description;

a profile unit that configures a first configuration of the electronic circuit at the reconfigurable hardware based on the first register transfer level description generated by the behavioral synthesis unit, actuates the electronic circuit, and causes the electric circuit to output the profile information from the actuated electronic circuit; and an optimizer that generates optimization information for optimizing the behavioral synthesis carried out by the behavioral synthesis unit based on the profile information that the profile unit causes the electric circuit to output, and outputs the generated optimization information to the behavioral synthesis unit, wherein the collected profile information is output from the electronic circuit during operation of the predetermined application, the behavioral synthesis unit acquires the first behavioral level description, and subjects the acquired first behavioral level description to behavioral synthesis and generates a second register transfer level description based on the optimization information output by the optimizer, and the profile unit configures a second configuration of the electronic circuit during operation of the predetermined application at the reconfigurable hardware based on the second register transfer level description which is generated by the behavioral synthesis unit.

2. The behavioral synthesis device according to claim 1, wherein the behavioral synthesis unit performs behavioral synthesis in such a manner that the electronic circuit based on the first behavioral level description and the electronic circuit based on the profile description are actuated in parallel.

3. The behavioral synthesis device according to claim 1, wherein the adding unit adopts information including at least one of a number of times of execution of a state, a number of times of selection of conditional branching, values written to a register or memory, values inputted from an input terminal, and values outputted to an output terminal designated by the user as the profile information, and the optimizer generates optimization information in such a manner as to reduce at least one of an area, a number of processing cycles, delays, or consumed power.

4. The behavioral synthesis device according to claim 3, wherein the profile unit has the user designate the profile information again when it is not possible to implement the electronic circuit at the reconfigurable hardware based on the acquired register transfer level description, and the adding unit adds, to the first behavioral level description, a profile description that causes the electronic circuit to collect the profile information designated again by the user according to a request from the user and output the collected profile information.

5. The behavioral synthesis device according to claim 1, wherein at least one of the first behavioral level description, the profile description, and the second behavioral level description is described by a high-level programming language or an intermediate representation of the high-level programming language.

6. The behavioral synthesis device according to claim 1, wherein the profile description is a register transfer level description that implements the electronic circuit that outputs after collecting the profile information, rather than a behavioral level description that causes the electronic circuit to collect the profile information for the electronic circuit and the behavioral synthesis unit adds the profile description to the register transfer level description obtained through behavioral synthesis of the first behavioral level description while subjecting the second behavioral level description to behavioral synthesis, and generates a register transfer level description.

7. The behavioral synthesis device according to claim 1, wherein rather than acquiring the first behavioral level description, the behavioral synthesis unit acquires the second behavioral level description, subjects the acquired second behavioral level description to behavioral synthesis based on the optimization information outputted by the optimizer and generates the second register transfer level description.

8. The behavioral synthesis device according to claim 7, wherein the profile unit implements the electronic circuit based on the second register transfer level description generated by the behavioral synthesis unit, actuates the implemented electronic circuit to re-output the profile information from the actuated electronic circuit;

the optimizer again generates optimization information for optimizing the behavioral synthesis carried out by the behavioral synthesis unit based on the profile information outputted again by the profile unit and again outputs the generated optimization information to the behavioral synthesis unit, and the behavioral synthesis unit subjects the second behavioral level description to behavioral synthesis and again generates the second register transfer level description based on the optimization information outputted again by the optimizer.

9. A behavioral synthesis method carried out by a behavioral synthesis device comprising:

a receiving step, by a receiving unit of the behavioral synthesis device, of receiving input of a first behavioral level description expressing an electronic circuit that operates a predetermined application and is implemented using reconfigurable hardware;

an adding step, by an addition unit of the behavioral synthesis device, of adding, to the first behavioral level description received by the receiving unit, a profile description that is a behavioral level description that causes the electronic circuit to collect profile information for the electronic circuit and output the collected profile information, and generating a second behavioral level description;

a behavioral synthesis step, by a behavioral synthesis unit of the behavioral synthesis device, of subjecting the second behavioral level description generated by the adding unit to behavioral synthesis and generating a first register transfer level description;

a profile step, by a profile unit of the behavioral synthesis device, of configuring a first configuration of the electronic circuit at the reconfigurable hardware based on the first register transfer level description generated by the behavioral synthesis unit, actuating the electronic circuit, and causing the electric circuit to output the profile information from the actuated electronic circuit; and an optimizing step, by an optimizer of the behavioral synthesis device, of generating optimization information for optimizing the behavioral synthesis carried out by the behavioral synthesis unit based on the profile information that the profile unit causes the electric circuit to output, and outputting the generated optimization information to the behavioral synthesis unit, wherein the collected profile information is output from the electronic circuit during operation of the predetermined application, the behavioral synthesis unit acquires the first behavioral level description, and subjects the acquired first behavioral level description to behavioral synthesis and generates a second register transfer level description based on the optimization information output by the optimizer, and the profile unit configures a second configuration of the electronic circuit during operation of the predetermined application at the reconfigurable hardware based on the second register transfer level description which is generated by the behavioral synthesis unit.

10. A non-transitory computer readable recording medium storing a program which when executed by a computer causes a computer to function as:

a receiving unit that receives input of a first behavioral level description expressing an electronic circuit that operates a predetermined application and is implemented using reconfigurable hardware;

an adding unit that adds, to the first behavioral level description received by the receiving unit, a profile description that is a behavioral level description that causes the electronic circuit to collect profile information for the electronic circuit and output the collected profile information, and generates a second behavioral level description;

a behavioral synthesis unit that subjects the second behavioral level description generated by the adding unit to behavioral synthesis and generates a first register transfer level description;

a profile unit that configures a first configuration of the electronic circuit at the reconfigurable hardware based on the first register transfer level description generated by the behavioral synthesis unit, actuates the electronic circuit, and causes the electric circuit to output the profile information from the actuated electronic circuit; and an optimizer that generates optimization information for optimizing the behavioral synthesis carried out by the behavioral synthesis unit based on the profile information that the profile unit causes the electric circuit to output, and outputs the generated optimization information to the behavioral synthesis unit, wherein the collected profile information is output from the electronic circuit during operation of the predetermined application, the behavioral synthesis unit acquires the first behavioral level description, and subjects the acquired first behavioral level description to behavioral synthesis and generates a second register transfer level description based on the optimization information output by the optimizer, and the profile unit configures a second configuration of the electronic circuit during operation of the predetermined application at the reconfigurable hardware based on the second register transfer level description which is generated by the behavioral synthesis unit.

11. A behavioral synthesis device comprising:

a receiving means that receives input of a first behavioral level description expressing an electronic circuit that operates a predetermined application and is implemented using reconfigurable hardware;

an adding means that adds, to the first behavioral level description received by the receiving means, a profile description that is a behavioral level description that causes the electronic circuit to collect profile information for the electronic circuit and output the collected profile information, and generates a second behavioral level description;

a behavioral synthesis means that subjects the second behavioral level description generated by the adding means to behavioral synthesis and generates a first register transfer level description;

a profile means that configures a first configuration of the electronic circuit at the reconfigurable hardware based on the first register transfer level description generated by the behavioral synthesis means, actuates the electronic circuit, and causes the electric circuit to output the profile information from the actuated electronic circuit; and an optimizer that generates optimization information for optimizing the behavioral synthesis carried out by the behavioral synthesis means based on the profile information that the profile means causes the electric circuit to output, and outputs the generated optimization information to the behavioral synthesis means, wherein the collected profile information is output from the electronic circuit during operation of the predetermined application, the behavioral synthesis means acquires the first behavioral level description, and subjects the acquired first behavioral level description to behavioral synthesis and generates a second register transfer level description based on the optimization information output by the optimizer, and the profile means configures a second configuration of the electronic circuit during operation of the predetermined application at the reconfigurable hardware based on the second register transfer level description which is generated by the behavioral synthesis means.

* * * * *